United States Patent
Kim et al.

(10) Patent No.: US 9,831,282 B2
(45) Date of Patent: Nov. 28, 2017

(54) ELECTRONIC DEVICE PACKAGE AND FABRICATING METHOD THEREOF

(71) Applicant: Amkor Technology, Inc., Tempe, AZ (US)

(72) Inventors: Jin Young Kim, Seoul (KR); No Sun Park, Gwangju-si (KR); Yoon Joo Kim, Seoul (KR); Seung Jae Lee, Namyangju-si (KR); Se Woong Cha, Gwangju-si (KR); Sung Kyu Kim, Seoul (KR); Ju Hoon Yoon, Namyangju-si (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/248,687

(22) Filed: Aug. 26, 2016

(65) Prior Publication Data

US 2016/0365379 A1    Dec. 15, 2016

Related U.S. Application Data

(63) Continuation of application No. 14/817,477, filed on Aug. 4, 2015, now Pat. No. 9,431,447, which is a
(Continued)

(30) Foreign Application Priority Data

Nov. 20, 2012  (KR) .................. 10-2012-0131963

(51) Int. Cl.
*H01L 29/06* (2006.01)
*H01L 27/146* (2006.01)
(Continued)

(52) U.S. Cl.
CPC .. *H01L 27/14636* (2013.01); *H01L 23/49811* (2013.01); *H01L 23/49827* (2013.01);
(Continued)

(58) Field of Classification Search
CPC ......... H01L 27/14636; H01L 23/49811; H01L 23/5286; H01L 24/20; H01L 27/14678;
(Continued)

(56) References Cited

U.S. PATENT DOCUMENTS 7,528,420 B2 *   5/2009   Weng ................ H01L 27/14618
                                                    257/117
7,851,246 B2 *  12/2010   Camacho ............ H01L 21/6835
                                                    257/433
(Continued)

FOREIGN PATENT DOCUMENTS

| JP | 2010153726 A | 7/2010 |
|---|---|---|
| KR | 20100136174 | 12/2010 |
| KR | 20120106629 A | 9/2012 |

*Primary Examiner* — Victor A Mandala
(74) *Attorney, Agent, or Firm* — McAndrews, Held & Malloy, Ltd.

(57) ABSTRACT

Various aspects of the present disclosure provide a semiconductor device, for example comprising a finger print sensor, and a method for manufacturing thereof. Various aspects of the present disclosure may, for example, provide an ultra-slim finger print sensor having a thickness of 500 μm or less that does not include a separate printed circuit board (PCB), and a method for manufacturing thereof.

20 Claims, 13 Drawing Sheets

Related U.S. Application Data continuation of application No. 14/082,482, filed on Nov. 18, 2013, now Pat. No. 8,129,873.

(51) Int. Cl.
*H01L 23/00* (2006.01)
*H01L 23/498* (2006.01)
*H01L 23/528* (2006.01)
*G06K 9/00* (2006.01)

(52) U.S. Cl.
CPC .......... *H01L 23/5286* (2013.01); *H01L 24/19* (2013.01); *H01L 24/20* (2013.01); *H01L 27/14618* (2013.01); *H01L 27/14678* (2013.01); *G06K 9/00006* (2013.01); *H01L 2224/211* (2013.01); *H01L 2224/214* (2013.01); *H01L 2924/12042* (2013.01); *H01L 2924/181* (2013.01)

(58) Field of Classification Search
CPC ............... H01L 23/49827; H01L 24/19; H01L 27/14618; H01L 2224/214; H01L 2224/211; H01L 2924/12042; H01L 2924/181; G06K 9/00006
See application file for complete search history.

(56) References Cited

U.S. PATENT DOCUMENTS

| | | | |
|---|---|---|---|
| 8,552,556 B1* | 10/2013 | Kim | H01L 23/16 257/685 |
| 8,717,775 B1* | 5/2014 | Bolognia | G06K 9/00053 361/761 |
| 9,129,873 B2* | 9/2015 | Kim | H01L 27/14618 |
| 9,431,447 B2* | 8/2016 | Kim | H01L 27/14618 |
| 2005/0095750 A1* | 5/2005 | Lo | H01L 21/56 438/114 |
| 2008/0009102 A1* | 1/2008 | Yang | H01L 21/568 438/126 |
| 2008/0096321 A1* | 4/2008 | Lin | H01L 27/14618 438/113 |
| 2010/0164082 A1 | 7/2010 | Fujisawa | |
| 2010/0187557 A1* | 7/2010 | Samoilov | H01L 27/144 257/99 |
| 2010/0320624 A1 | 12/2010 | Kang | |
| 2012/0256280 A1* | 10/2012 | Erhart | H01L 21/561 257/414 |
| 2013/0221452 A1* | 8/2013 | Strothmann | H01L 24/19 257/414 |
| 2014/0138788 A1 | 5/2014 | Kim et al. | |

* cited by examiner

ELECTRONIC DEVICE PACKAGE AND FABRICATING METHOD THEREOF

CROSS-REFERENCE TO RELATED APPLICATIONS/INCORPORATION BY REFERENCE

The present application is a CONTINUATION of U.S. patent application Ser. No. 14/817,477, filed Aug. 4, 2015, titled "PACKAGE OF FINGER PRINT SENSOR AND FABRICATING METHOD THEREOF," issuing as U.S. Pat. No. 9,431,447, which is a CONTINUATION of U.S. patent application Ser. No. 14/082,482, filed Nov. 18, 2013, entitled "PACKAGE OF FINGER PRINT SENSOR AND FABRICATING METHOD THEREOF," now U.S. Pat. No. 9,129,873, which makes reference to, claims priority to, and claims the benefit of Korean Patent Application No. KR 10-2012-0131963 filed on Nov. 20, 2012 in the Korean Intellectual Property Office and titled "PACKAGE OF FINGER PRINT SENSOR AND FABRICATING METHOD THEREOF," the contents of each of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present finger print sensor packages and methods for fabrication thereof are inadequate. Further limitations and disadvantages of conventional and traditional approaches will become apparent to one of skill in the art, through comparison of such approaches with various aspects of the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

Common reference numerals are used throughout the drawings and the detailed description to indicate the same or similar elements.

DETAILED DESCRIPTION

Figure 1:
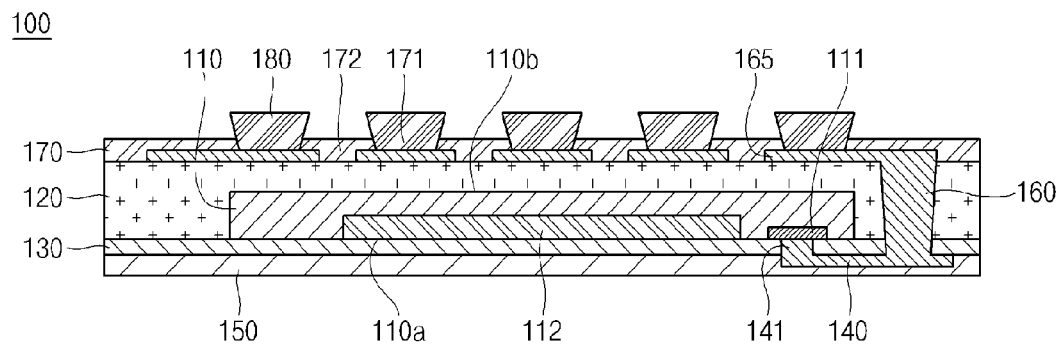
FIG. 1 is a cross-sectional view of a package of a finger print sensor according to an example embodiment of the present disclosure.

Various aspects of the present disclosure relate to a package of a finger print sensor and a fabricating method thereof. For example, various aspects of the present disclosure relate to a package of a finger print sensor and a fabricating method thereof, which can fabricate an ultra-slim finger print sensor having a thickness of 500 μm or less without using a separate printed circuit board (PCB).

Semiconductor packages are used in a wide variety of products. According to the recent tendency toward slimness and miniaturization of the products, attempts to reduce the size of semiconductor packages are being made. To this end, some attention is being focused on a flip chip package in which a solder bump is directly formed on a surface of a semiconductor die and a through silicone via (TSV) package in which a TSV is formed in a bond pad of a semiconductor die. The flip chip package or the TSV package generally comprises a redistribution layer (RDL) connected to the bond pad of the semiconductor die to redistribute a portion, for example a contact, to be connected to a solder bump. In various example scenarios, RDL design may be important in fabricating a semiconductor package. However, the RDL design is often performed in a limited area, making an RDL pattern complicated and requiring a considerable amount of time.

In accordance with various aspects of the present disclosure, there is provided a package of a finger print sensor and a fabricating method thereof, which for example can fabricate an ultra-slim finger print sensor having a thickness of 500 μm or less without using a separate printed circuit board (PCB).

According to various aspects of the present disclosure, there is provided an example finger print sensor package comprising a semiconductor die that comprises a first surface having a sensor and a plurality of bond pads formed thereon and a second surface facing the first surface (e.g., on a side of the semiconductor die opposite the first surface), where the second surface is enclosed by an encapsulant, a first passivation layer covering the first surface of the semiconductor die and having openings patterned to expose the bond pads, first redistribution layers (RDLs) electrically connected to the bond pads exposed through the first passivation layer, vias electrically connected to the first RDLs and formed to pass through the encapsulant, second RDLs electrically connected to the vias and formed on the encapsulant, a second passivation layer exposing the second RDLs and formed to cover the second RDLs and the encapsulant, and land grid arrays (LGAs) electrically connected to the second RDLs exposed through the second passivation layer.

The first RDLs may, for example, be formed while filling the openings.

The first RDLs may, for example, extend to the outside of the semiconductor die (e.g., extend to a position outside the footprint of the semiconductor die).

One end of each of the first RDLs may, for example, be electrically connected to each of the bond pads, and the other end of each of the first RDLs may, for example, be connected to the vias.

The finger print sensor package may, for example, further comprise a protection layer covering the first passivation layer and the first RDLs.

The protection layer and the encapsulant may, for example, be made of the same material.

At least one of the first RDLs may, for example, be formed as a ground pattern for preventing static electricity.

According to various aspects of the present disclosure, there is provided an example package of a finger print sensor, the finger print sensor package comprising a semiconductor die that comprises a first surface having a sensor and a plurality of bond pads formed thereon and a second surface facing the first surface (e.g., on a side of the semiconductor die opposite the first surface); an encapsulant enclosing side surfaces of the semiconductor die, excluding the first and second surfaces; a first lower passivation layer covering the first surface of the semiconductor die and having openings patterned to expose the bond pads; first redistribution layers (RDLs) electrically connected to the bond pads exposed through the first lower passivation layer; a first upper passivation layer covering the second surface of the semiconductor die; vias electrically connected to the first RDLs and formed to pass through the encapsulant; second RDLs electrically connected to the vias and formed on the first upper passivation layer; a second upper passivation layer exposing the second RDLs and covering the second RDLs and the first upper passivation layer; and solder balls electrically connected to the second RDLs exposed through the second upper passivation layer.

The first RDLs may, for example, be formed while filling the openings.

The first RDLs may, for example, extend to the outside of the semiconductor die (e.g., extend to a position outside the footprint of the semiconductor die).

One end of each of the first RDLs may, for example, be electrically connected to each of the bond pads and the other end of each of the first RDLs may, for example, be connected to the vias.

The finger print sensor package may, for example, further comprise a second lower passivation layer covering the first lower passivation layer and the first RDLs.

The second lower passivation layer and the encapsulant may, for example, be made of the same material.

At least one of the first RDLs may, for example, be formed as a ground pattern for preventing static electricity.

According to various aspects of the present disclosure, there is provided an example fabricating method of a package of a finger print sensor, the fabricating method comprising providing a semiconductor die that comprises a first surface having a sensor and a plurality of bond pads formed thereon and a second surface facing the first surface (e.g., on a side of the semiconductor die opposite the first surface), forming an encapsulant on the second surface, forming a first passivation layer comprising openings exposing the bond pads on the first surface of the semiconductor die, forming first redistribution layers (RDLs) electrically connected to the bond pads exposed through the first passivation layer, forming vias electrically connected to the first RDLs and formed to pass through the encapsulant, forming second RDLs electrically connected to the vias and formed on the encapsulant, forming a second passivation layer covering the second RDLs and the encapsulant and exposing the second RDLs, and forming one or more land grid arrays (LGAs) electrically connected to the exposed second RDLs.

The forming of the first RDLs may, for example, comprise forming the first RDLs to fill the openings.

The forming of the first RDLs may, for example, comprise forming the first RDLs to extend to the outside of the semiconductor die (e.g., extend to a position outside the footprint of the semiconductor die).

The forming of the first RDLs may, for example, comprise forming the first RDLs such that one end of each of the first RDLs is electrically connected to each of the bond pads and the other end of each of the first RDLs may be connected to the vias.

After the forming of the first RDLs, the fabricating method may, for example, further comprise forming a protection layer to cover the first passivation layer and the first RDLs.

Before the forming of the vias, the fabricating method may, for example, further comprise grinding the encapsulant.

After the forming of the LGAs, the fabricating method may, for example, further comprise grinding the protection layer for removal.

According to various aspects of the present disclosure, there is provided an example fabricating method of a package of a finger print sensor, the fabricating method comprising providing a semiconductor die that comprises a first surface having a sensor and a plurality of bond pads formed thereon and a second surface facing the first surface (e.g., on a side of the semiconductor die opposite the first surface), forming an encapsulant enclosing side surfaces of the semiconductor die, excluding the first and second surfaces, forming a first lower passivation layer having openings exposing the bond pads on the first surface of the semiconductor die, forming first redistribution layers (RDLs) electrically connected to the bond pads exposed through the first lower passivation layer, forming a first upper passivation layer on the second surface of the semiconductor die, forming vias electrically connected to the first RDLs to pass through the encapsulant, forming second RDLs electrically connected to the vias, forming a second upper passivation layer covering the second RDLs and the first upper passivation layer to expose the second RDLs, and forming solder balls electrically connected to the exposed second RDLs.

The forming of the first RDLs may, for example, comprise forming the first RDLs to fill the openings.

The forming of the first RDLs may, for example, comprise forming the first RDLs to extend to the outside of the semiconductor die (e.g., extend to a position outside the footprint of the semiconductor die).

The forming of the first RDLs may, for example, comprise forming the first RDLs such that one end of each of the first RDLs is electrically connected to each of the bond pads and the other end of each of the first RDLs may, for example, be connected to the vias.

After the forming of the first RDLs, the fabricating method may, for example, further comprise forming a second lower passivation layer to cover the first lower passivation layer and the first RDLs.

After the forming of the second lower passivation layer, the fabricating method may, for example, further comprise grinding the second surface of the semiconductor die and the encapsulant for removal.

As described above, in an example finger print sensor package and an example fabricating method thereof according to various aspects of the present disclosure, a separate printed circuit board (PCB) might not be used, thereby fabricating an ultra-slim finger print sensor having a thickness of 500 μm or less.

Various aspects of the present disclosure will be more apparent from the following detailed description taken in conjunction with the accompanying drawings.

Hereinafter, examples of various embodiments of the disclosure will be described in detail with reference to the accompanying drawings such that they can readily be made and used by those skilled in the art.

FIG. 1 is a cross-sectional view of a package of a finger print sensor according to an embodiment of the present disclosure.

Referring to FIG. 1, the finger print sensor package 100 according to an embodiment of the present disclosure may comprise a semiconductor die 110, an encapsulant 120, a first passivation layer 130, a first redistribution layer (RDL) 140, a protection layer 150, a via 160, a second RDL 165, a second passivation layer 170 and land grid array (LGA) lands 180.

The semiconductor die 110 is generally made of a silicon material and has a plurality of semiconductor devices formed therein. In addition, the semiconductor die 110 may comprise a first surface 110a and a second surface 110b opposite to and facing each other. A plurality of bond pads 111 and a sensor 112 are formed on the first surface 110a of the semiconductor die 110. The bond pads 111 are generally electrical contacts for inputting/outputting electrical signals to/from the semiconductor die 110 and are plurally provided at spaced-apart locations on the first surface 110a. The sensor 112, for example, photographs a finger print image, and an electrical signal of the finger print image is input/output through the bond pads 111.

The encapsulant 120 is formed to enclose the second surface 110b and side surfaces (e.g., side surfaces connecting the first surface 110a and the second surface 110b) of the semiconductor die 110. In addition, the encapsulant 120 may extend horizontally from the first surface 110a of the semiconductor die 110, for example while not covering the first surface 110a. The encapsulant 120 may, for example, seal the semiconductor die 110 to protect the semiconductor die 110 from heat, moisture or shock, and may, for example, be formed using an epoxy molding compound (EMC), painting, or printing.

The first passivation layer 130 may, for example, be formed to cover the first surface 110a of the semiconductor die 110 and the encapsulant 120. The first passivation layer 130 may, for example, electrically insulate the semiconductor die 110 at regions other than the bond pads 111. In addition, the first passivation layer 130 may have openings formed at respective portions adjacent to the bond pads 111 to expose the bond pads 111. The openings may, for example, provide paths through which the bond pads 111 may be electrically connected to an external device.

The first RDL 140 may, for example, be formed under the first passivation layer 130 to extend to the outside of the semiconductor die 110 (e.g., extend to or near to the outside). The first RDL 140 comprises a first end 141 of the first RDL 140 formed while filling the openings (e.g., the openings in the first passivation layer 130). The first RDL 140 is electrically connected to the bond pads 111 of the semiconductor die 110 through the first end 141 of the first RDL 140.

The first RDL 140 redistributes electrical paths of the semiconductor die 110. For example, the first RDL 140 redistributes electrical paths to connect the bond pads 111 to the via 160, irrespective of locations of the bond pads 111. The first RDL 140 may, for example, be made of copper or an equivalent thereof.

The protection layer 150 is formed, for example, to cover the first passivation layer 130 and the first RDL 140. The protection layer 150 may, for example, be formed on an outer surface of the finger print sensor package 100 and protect the finger print sensor package 100 from the outer environment. In addition, the protection layer 150 may, for example, have a thickness of 200 μm or less. If the thickness of the protection layer 150 is greater than 200 μm, the sensor 112 might not be able to reliably photograph an image through the protection layer 150, which is not desirable.

The protection layer 150 and the encapsulant 120 may, for example, be made of the same material. A semiconductor package may undergo deformation due to heat generated during operation. The encapsulant 120 and the protection layer 150 may be formed using the same material to make the encapsulant 120 and the protection layer 150 have the same coefficient of thermal expansion (CTE), thereby minimizing deformation due to heat. Alternatively, for example, different materials having the same or substantially similar respective CTEs (e.g., within 2%, 5%, or 10%) may be used.

In FIG. 1, the finger print sensor package 100 comprises the protection layer 150. However, the finger print sensor package 100 might not comprise the protection layer 150.

The via 160 is connected to the second end of the first RDL 140 and is formed to pass through the encapsulant 120. In addition, the via 160 is connected to the second RDL 165 formed on the encapsulant 120. In such a manner, the via 160 connects the first RDL 140 to the second RDL 165.

The second RDL 165 redistributes the electrical paths of the semiconductor die 110. That is to say, the second RDL 165 redistributes the electrical paths through which the lands of the LGA 180 are connected to be matched with external circuit patterns. The via 160 and the second RDL 165 may, for example, be made of copper or an equivalent thereof.

In addition, referring to FIG. 1, the second RDL 165 may be formed in plurality, for example where the plurality of second RDLs 165 are separated from each other by spaced-apart regions. The plurality of second RDLs 165 may, for example, be connected to the plurality of bond pads 111 of the semiconductor die 110 in one-to-one correspondence.

The second passivation layer 170 is formed on the encapsulant 120 and the second RDLs 165. The second passivation layer 130 may, for example, electrically insulate the second RDLs 165 from an external region.

The second passivation layer 170 comprises first regions 171 through which the second RDLs 165 are exposed, and second regions 172 formed to cover portions of the second RDLs 165 and spaced-apart regions between the second RDLs 165. The second RDLs 165 exposed through the first regions 171 may be paths through which the second RDLs 165 are electrically connected to the external region. In addition, since the second regions 172 cover the spaced-apart regions between the second RDLs 165, the plurality of second RDLs 165 may be further insulated or isolated from each other.

The LGA lands 180 are formed on the first regions 171 of the second passivation layer 170, that is, the exposed second RDLs 165. The LGA lands 180 establish paths through which the semiconductor die 110 may be electrically connected to an external circuit. In addition, the LGA lands 180 may be further electrically insulated or isolated from each other by the second regions 172 of the second passivation layer 170. In the illustrated embodiment of FIG. 1, the LGA lands 180 are formed on the first regions 171, but aspects of the present disclosure are not limited thereto. For example, balls or other electrically connective structures may be formed on the first regions 171, instead of the LGA lands 180.

As described above, in the finger print sensor package 100 according to an example embodiment of the present disclosure, the first RDL 140 and the second RDL 165 may be formed on and under the semiconductor die 110, and the first RDL 140 and the second RDL 165 may be electrically connected to each other through the via 160. In such an example configuration, among other configurations, an ultra-slim package finger print sensor having a thickness of 500 μm or less may be fabricated without using a separate printed circuit board (PCB) or other substrate.

Hereinafter, a package of a finger print sensor according to another example embodiment of the present disclosure will be described.

Figure 2:
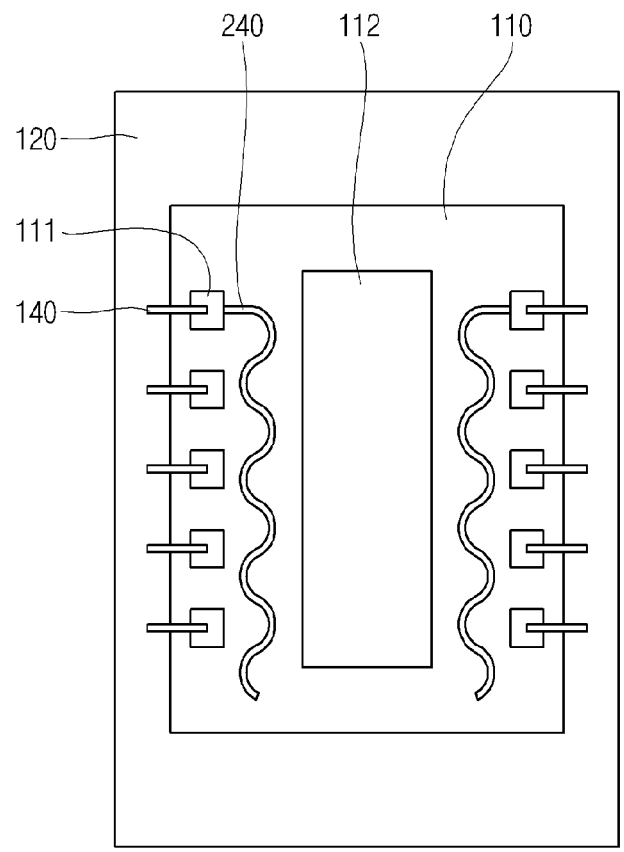
FIG. 2 is a plan view illustrating a semiconductor die, an encapsulant and a first redistribution layer in a package of a finger print sensor according to another example embodiment of the present disclosure.

FIG. 2 is a plan view illustrating a semiconductor die (110), an encapsulant (120) and a first redistribution layer (140) in a package of a finger print sensor according to another embodiment of the present disclosure. The present example embodiment illustrated in FIG. 2 is substantially the same as the previous example embodiment illustrated in FIG. 1, except for example that a ground pattern may be formed by at least one first RDL 140. The following description will focus on differences between the present and previous example embodiments.

In the finger print sensor package according to the example embodiment shown in FIG. 2, at least one first RDL 140 may be formed as a ground RDL 240 having a ground pattern.

The finger print sensor 112 may, for example, photograph a finger print image by touching a finger (e.g., by direct contact or via a protection layer). The ground RDL 240 may, for example, protect the sensor 112 from being damaged due to static electricity generated when the finger touches the sensor 112 (e.g., electrostatic discharge). In such an example configuration, since a separate material for preventing damage due to static electricity might not be required, a simplified finger print sensor package can be fabricated.

Hereinafter, a package of a finger print sensor according to still another example embodiment of the present disclosure will be described.

Figure 3:
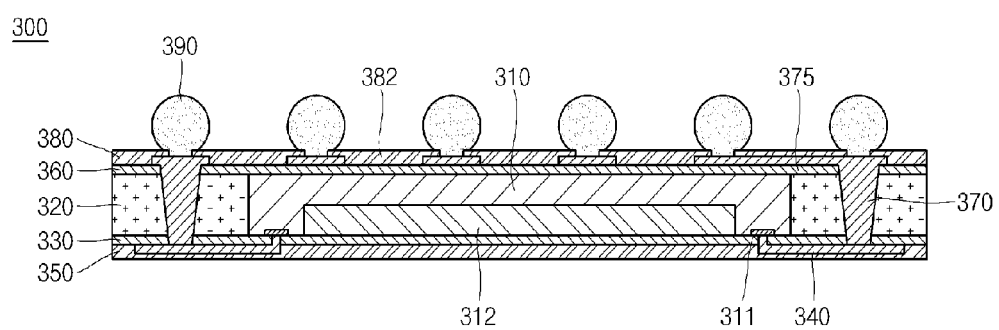
FIG. 3 is a cross-sectional view of a package of a finger print sensor according to still another example embodiment of the present disclosure.

FIG. 3 is a cross-sectional view of a package of a finger print sensor according to still another example embodiment of the present disclosure.

Referring to FIG. 3, the finger print sensor package 300 according to an example embodiment of the present disclosure comprises a semiconductor die 310, an encapsulant 320, a first lower passivation layer 330, first RDLs 340, a second lower passivation layer 350, a first upper passivation layer 360, vias 370, second RDLs 375, a second upper passivation layer 380 and solder balls 390. The following description will focus on differences between the present and previous embodiments. Note that the features of the example embodiments discussed herein may be interchanged (e.g., features of the example embodiment shown in FIG. 3 may be incorporated into the other example embodiments disclosed herein, and vice versa).

The semiconductor die 310 may generally be made of a silicon material and have a plurality of semiconductor devices formed therein. In addition, the semiconductor die 310 may comprise a first surface and a second surface opposite to and facing each other. A plurality of bond pads 311 and a sensor 312 are formed on the first surface of the semiconductor die 310. The bond pads 311 may, for example, comprise portions for inputting/outputting electrical signals to/from the semiconductor die 310 and may be plurally provided at spaced-apart locations on the first surface. The sensor 312 may, for example, photograph or otherwise capture a finger print image, and an electrical signal of the finger print image may be input/output through the bond pads 311.

The encapsulant 320 may be formed to enclose side surfaces of the semiconductor die 310 (e.g., side surfaces connecting the first and second surfaces), except for the first and second surfaces of the semiconductor die 310. In addition, the encapsulant 320 may extend horizontally from the first and second surfaces of the semiconductor die 310. Since the example encapsulant 320 is formed to cover only the side surfaces of the semiconductor die 310, the finger print sensor package 300 can be fabricated with a reduced thickness. The encapsulant 320 may, for example, be formed using an epoxy molding compound (EMC), painting, or printing.

The first lower passivation layer 330 is formed to cover the first surface of the semiconductor die 310 and a bottom surface of the encapsulant 320 extending horizontally from the first surface of the semiconductor die 310. The first lower passivation layer 330 may, for example, further electrically insulate (or isolate) the semiconductor die 310 from regions other than the bond pads 311. In addition, the first lower passivation layer 330 has openings to expose the bond pads 311. The openings are paths through which the bond pads 311 may be electrically connected to an external device.

The first RDLs 340 are formed under the first passivation layer 330 to extend to the outside of the semiconductor die 310 (e.g., extend to a position outside the footprint of the semiconductor die). Each of the first RDLs 340, for example, comprises one end formed while filling the openings in the first passivation layer 330. The first RDLs 340 are electrically connected to the bond pads 311 of the semiconductor die 310 through a first end of each of the first RDLs 340.

The second lower passivation layer 350 is formed to cover the first lower passivation layer 330 and the first RDLs 340. The second lower passivation layer 350 is formed on an outer surface of the finger print sensor package 300 (e.g., over the first lower passivation layer 330) and protects the finger print sensor package 300 from the outer environment. In addition, the second lower passivation layer 350 may be formed using the same material with the encapsulant 320 and the first lower passivation layer 330 to make the encapsulant 320, the first lower passivation layer 330 and the second lower passivation layer 350 have the same coefficient of thermal expansion (CTE), thereby minimizing deformation due to heat. Alternatively, for example, different materials having the same or substantially similar respective CTEs (e.g., within 2%, 5%, or 10%) may be used.

The first upper passivation layer 360 is formed to cover the second surface of the semiconductor die 310 and the top surface of the encapsulant 320 extending horizontally from the second surface of the semiconductor die 310. The first upper passivation layer 360 may, for example, electrically insulate (or isolate) the semiconductor die 310 from an external region.

Each of the vias 370 is connected to the second end of each of the first RDLs 340 and is formed to pass through the encapsulant 320, the first lower passivation layer 330 and the first upper passivation layer 360. In addition, the vias 370 are connected to the second RDLs 375 formed on the first upper passivation layer 360. In such a manner, the vias 370 connect the first RDLs 340 to the second RDLs 375.

The second upper passivation layer 380 is formed to cover the first upper passivation layer 360 and portions of the second RDLs 375. The second upper passivation layer 380 may further electrically insulate (or insulate) the second RDLs 375 from an external region. The second upper passivation layer 380 comprises a first region through which the second RDLs 375 are exposed, and a second region 382 formed to cover portions of the second RDLs 375 and spaced-apart regions between the second RDLs 375. The first region establishes paths through which the second RDLs 375 may be electrically connected to an external circuit. In addition, since the second region 382 is formed to cover the spaced-apart regions between the second RDLs 375, the plurality of second RDLs 375 are further insulated (or isolated) from each other.

The solder balls 390 are electrically connected to the first region 381 of the second upper passivation layer 380, that is, the exposed portions of the second RDLs 375. The solder balls 390 establish paths through which the semiconductor die 310 may be electrically connected to an external circuit.

As described above, in the finger print sensor package 300 according to an example embodiment of the present disclosure, the encapsulant 320 encloses only side surfaces of the semiconductor die 310, and the first upper passivation layer 360, which is relatively thin, is formed to cover the second surface of the semiconductor die 310. In such an example configuration, an ultra-slim finger print sensor package can be fabricated.

Hereinafter, a fabricating method of a package of a finger print sensor according to an example embodiment of the present disclosure will be described.

Figure 4:
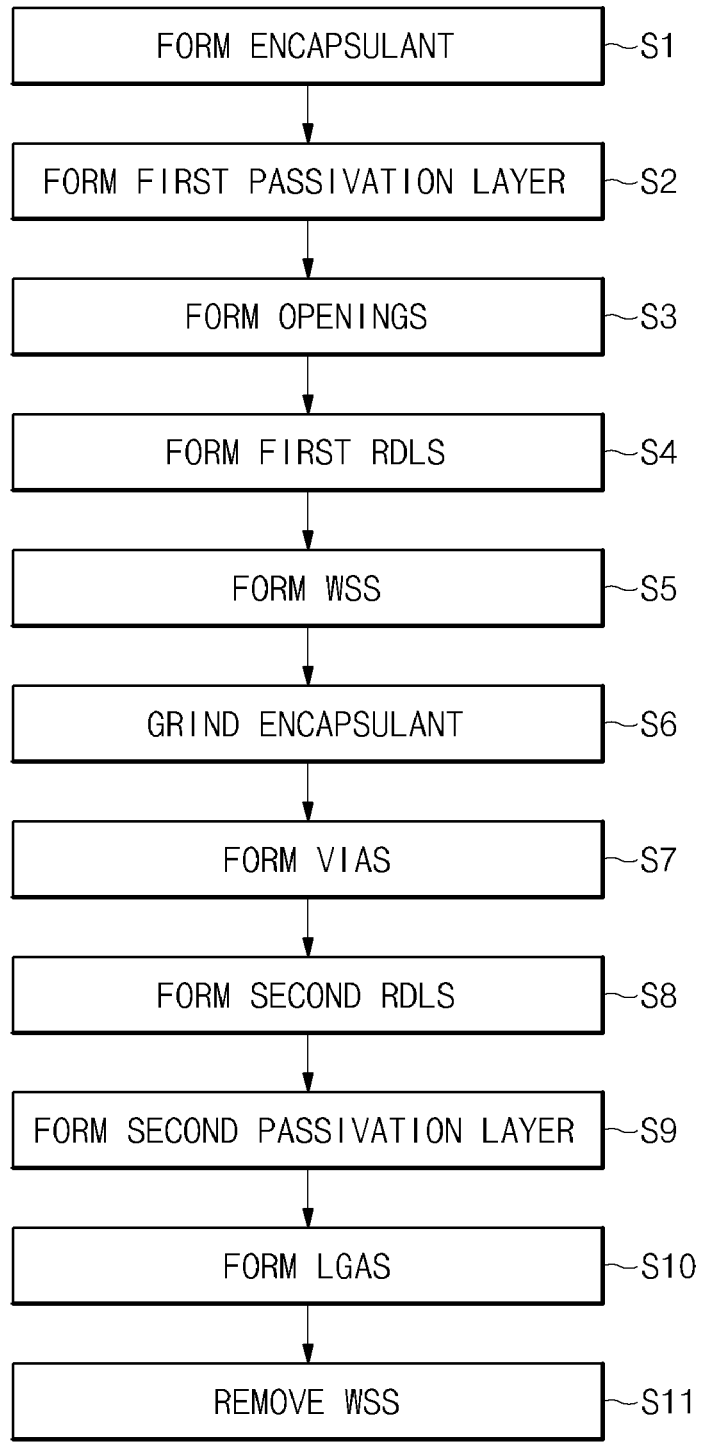
FIG. 4 is a flowchart illustrating a fabricating method of a package of a finger print sensor according to an example embodiment of the present disclosure.

FIG. 4 is a flowchart illustrating a fabricating method of a package of a finger print sensor according to an example embodiment of the present disclosure.

As illustrated in FIG. 4, a fabricating method of a finger print sensor package (e.g., the finger print sensor package 100 illustrated in FIG. 1, or variants thereof) according to an example embodiment of the present disclosure may comprise forming an encapsulant (S1), forming a first passivation layer (S2), forming openings (S3), forming first RDLs (S4), forming a protection layer (S5), grinding the encapsulant (S6), forming vias (S7), forming second RDLs (S8), forming a second passivation layer (S9), forming LGAs lands (S10), and removing the protection layer (S11).

FIGS. 5A to 5K are cross-sectional views sequentially illustrating example process steps of the example fabricating method of a package of a finger print sensor shown in FIG. 4.

Hereinafter, the example fabricating method of a finger print sensor package (e.g., the example finger print sensor package 100 illustrated in FIG. 1 and discussed previously or variants thereof) according to an example embodiment of the present disclosure will be described in detail with reference to FIGS. 4 and 5A to 5K.

Figure 5A:
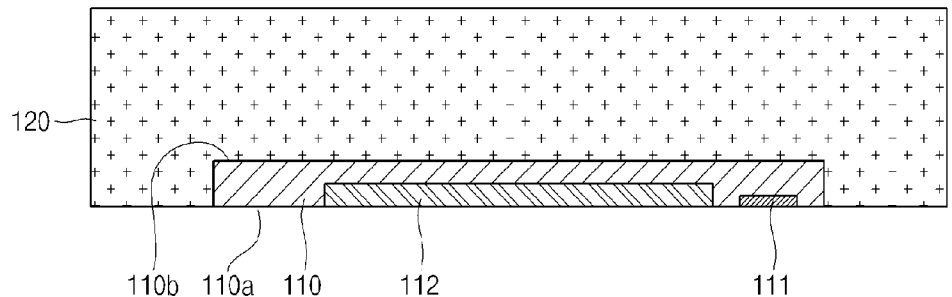
FIGS. 5A to 5K are cross-sectional views sequentially illustrating example process steps of the fabricating method of a package of a finger print sensor shown in FIG. 4.

Referring to FIGS. 4 and 5A, in the forming of the encapsulant (S1), the encapsulant 120 is formed on the semiconductor die 110. The semiconductor die 110 comprises a first surface 110a having a plurality of bond pads 111 and a sensor 112 formed thereon and a second surface 110b opposite to and facing the first surface 110a. In addition, the encapsulant 120 is formed to horizontally extend from the first surface 110a so as to enclose the second surface 110b and side surfaces of the semiconductor die 110. The encapsulant 120 may, for example, be formed using an epoxy molding compound (EMC), painting, or printing.

Figure 5B:
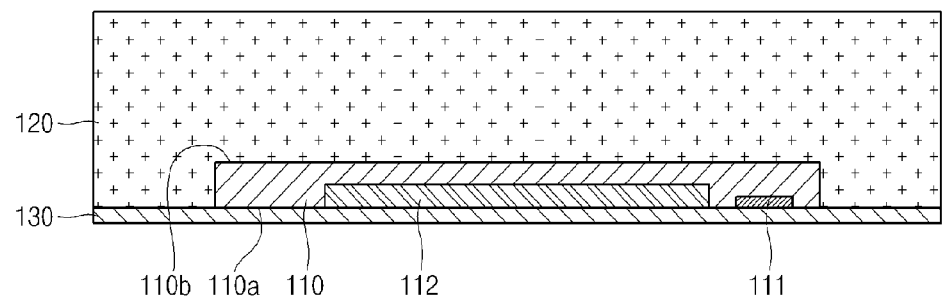

Referring to FIGS. 4 and 5B, in the forming of a first passivation layer (S2), the first passivation layer 130 is formed on the first surface 110a of the semiconductor die 110. The first passivation layer 130 is formed to cover the first surface 110a and the encapsulant 120 that extends horizontally from the first surface 110a.

Figure 5C:
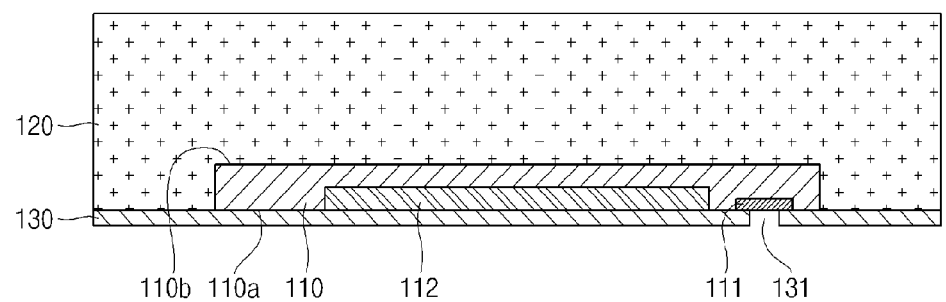

Referring to FIGS. 4 and 5C, in the forming of openings (S3), the openings 131 are formed in some regions of the first passivation layer 130. The forming of openings (S3), for example, may comprise forming a photoresist on the first passivation layer 130 and then etching and removing the photoresist. The openings 131 may, for example, be formed by etching the first passivation layer 130 using the photoresist. The openings 131 expose the bond pads 111.

Figure 5D:
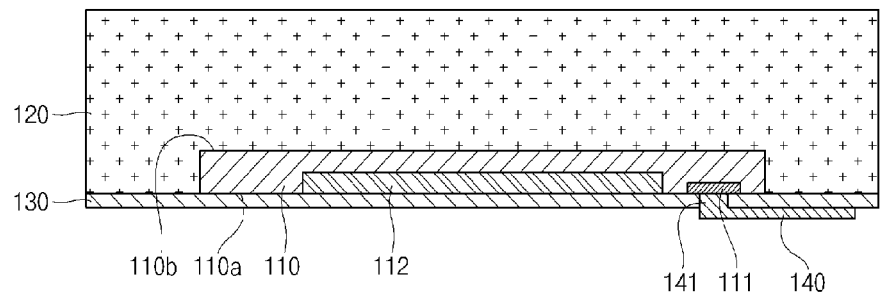

Referring to FIGS. 4 and 5D, in the forming of first RDLs (S4), the first RDLs 140 are formed on the first passivation layer 130 (e.g., below the first passivation layer 130 as it is shown in FIG. 5D) to extend to the outside of the semiconductor die 110 (e.g., outside the footprint of the semiconductor die 110). Each of the first RDLs 140 may, for example, be formed to have a first end 141 filling each of the openings 131.

The first RDLs 140 may, for example, be formed by electroplating. The forming of the first RDLs (S4) may, for example, comprise coating and patterning a photoresist on a region of the first passivation layer 130, other than potential regions where the first RDLs 140 are to be formed. In addition, a metal seed layer may be formed between the potential regions where the first RDLs 140 are to be formed, that is, patterns of the photoresist. Thereafter, current may be made to flow using the metal seed layer as a seed, thereby forming the first RDLs 140. After the forming of the first RDLs 140, the photoresist is removed. The first RDLs 140 may, for example, be made of copper or an equivalent thereof. As illustrated in FIG. 2 and discussed previously, the forming of the first RDLs (S4) may comprise forming one or more ground RDLs that surround the sensor 112, or any portion of the semiconductor die 110, on 1, 2, 3 or 4 sides.

Figure 5E:
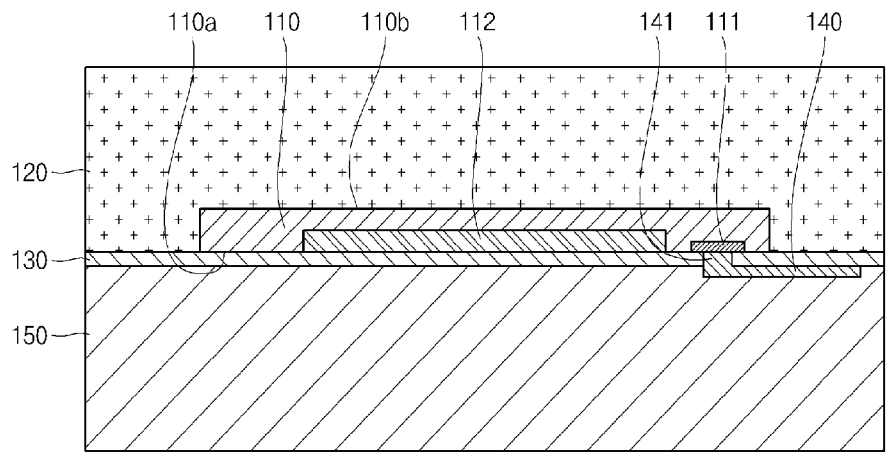

Referring to FIGS. 4 and 5E, in the forming of a protection layer (S5), the protection layer 150 is formed to cover the first passivation layer 130 and the first RDLs 140 (e.g., below the first passivation layer 130 and first RDLs 140 as illustrated in FIG. 5E).

In the configuration of the finger print sensor package according to an example embodiment of the present disclosure, the protection layer 150 is expressed as it is, but may serve as a wafer supporting system (WSS) for supporting and fixing a semiconductor wafer in terms of a fabricating process. Therefore, in describing the finger print sensor package 100, the protection layer and the WSS may be considered the same with each other in view of configuration, although they are differently named.

The protection layer 150 is formed under the first passivation layer 130 and the first RDLs 140 and fixedly supports the semiconductor die 110. The protection layer 150 may, for example, be formed to have a thickness of 200 to 300 μm. In addition, the protection layer 150 and the encapsulant 120 may be made of the same material, or for example different materials with same or similar respective CTEs.

Figure 5F:
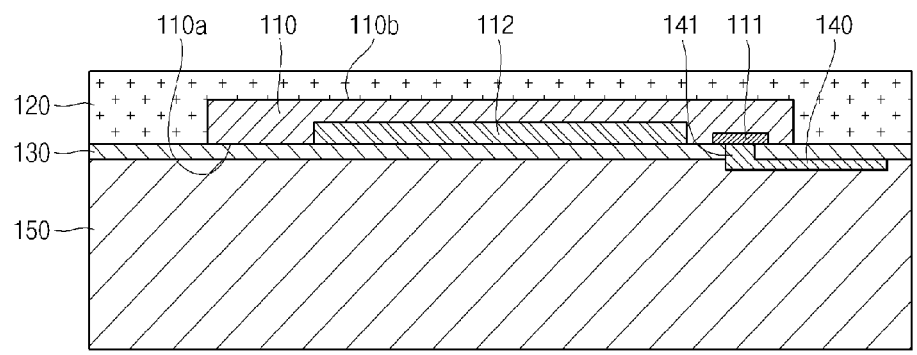

Referring to FIGS. 4 and 5F, in the grinding of the encapsulant (S6), the encapsulant 120 is subjected to grinding (or alternative thinning operation). The grinding of the encapsulant (S6) may, for example, facilitate the formation of vias 160 in a subsequent process by reducing the thickness of the encapsulant 120. Here, the semiconductor die 110 is fixed to and/or supported by the protection layer 150, so that impacts applied thereto during grinding or other operations may be dampened.

Figure 5G:
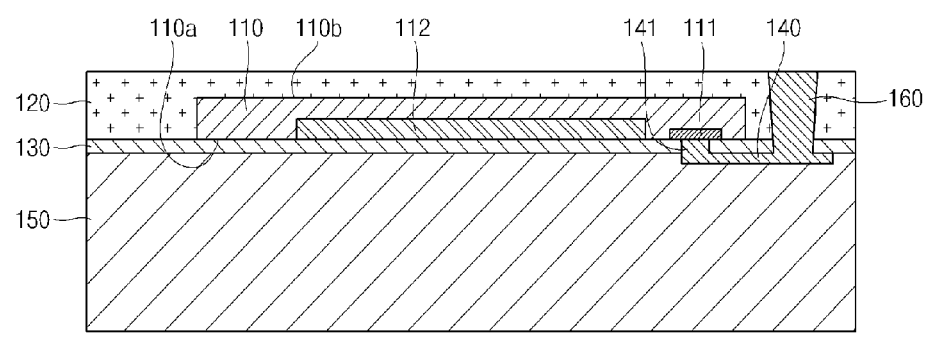

Referring to FIGS. 4 and 5G, in the forming of vias (S7), the vias 160 are formed to pass through the encapsulant 120. The vias 160 are electrically connected to the second end of each of the first RDLs 140 (e.g., the ends of the first RDLs 140 that are positioned outside the footprint of the first semiconductor die 110) and may, for example, be connected to the second RDLs 165 to be formed later. The forming of the vias (S7) may, for example, comprise forming holes in the encapsulant 120 using laser irradiation, drilling or chemically etching and then filling the holes with copper or an equivalent thereof.

Figure 5H:
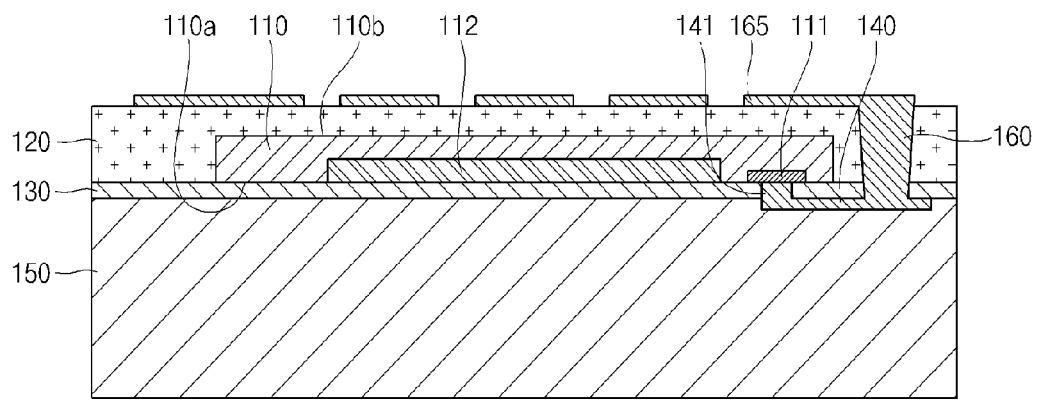

Referring to FIGS. 4 and 5H, in the forming of second RDLs (S8), the second RDLs 165 are formed on the encapsulant 120 (e.g., above the encapsulant 120 as illustrated in FIG. 5H). The second RDLs 165 are electrically connected to the vias 160.

Specifically, referring to FIG. 5H, the second RDLs 165 may be plurally formed to be spaced apart from each other. The plurality of second RDLs 165 are formed to be spaced apart from each other by spaced-apart regions, and the plurality of second RDLs 165 may be connected to the plurality of bond pads 111 of the semiconductor die 110, for example in one-to-one correspondence.

Like the first RDLs 140, the second RDLs 165 may, for example, be formed by electroplating and may be made of copper or an equivalent thereof.

Figure 5I:
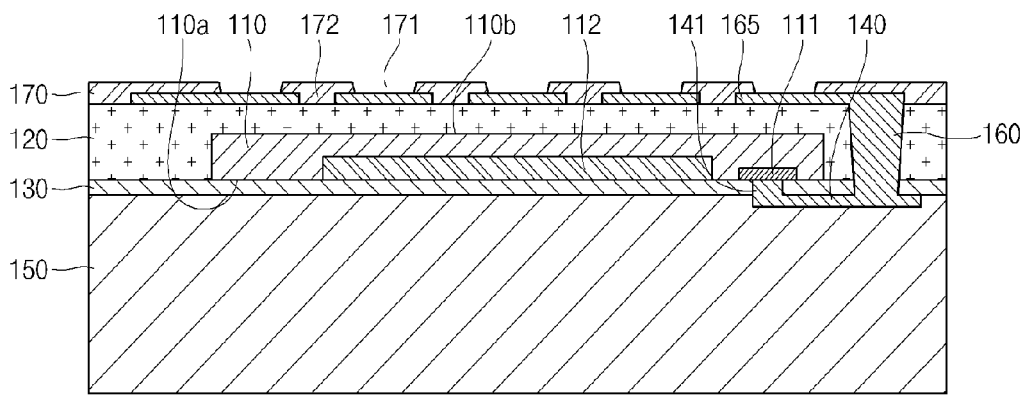

Referring to FIGS. 4 and 5I, in the forming of a second passivation layer (S9), the second passivation layer 170 is formed on the encapsulant 120 and the second RDLs 165. The forming of a second passivation layer (S9) comprises forming a photoresist on regions through which the second RDLs 165 are to be exposed and then filling the other regions with the second passivation layer 170. Therefore, the second passivation layer 170 may comprise first regions 171 through which the second RDLs 165 are exposed, and second regions 172 formed to cover portions of the second RDLs that are not to be exposed and to cover the spaced-apart regions between the second RDLs 165. The second regions 172 fill the spaced-apart regions of the second RDLs 165, thereby further electrically insulating (or isolating) the plurality of second RDLs 165 from each other.

Figure 5J:
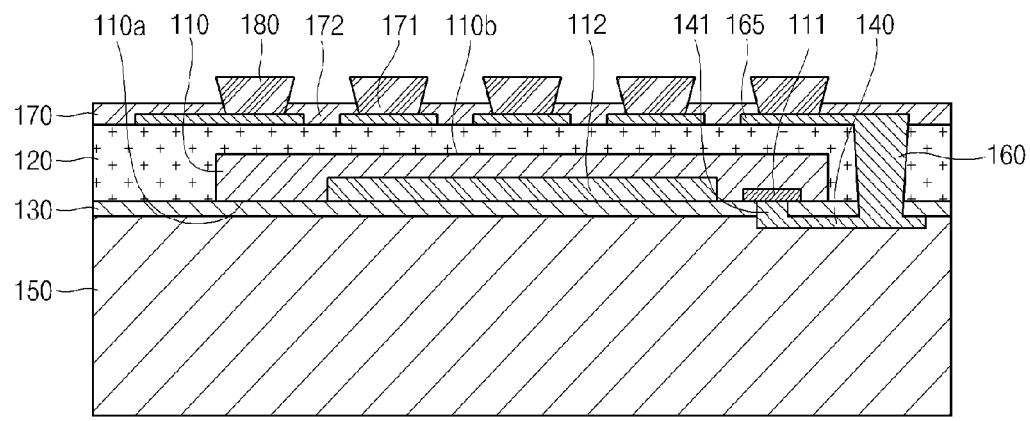

Referring to FIGS. 4 and 5J, in the forming LGA lands (S10), the LGA lands 180 are formed on the second RDLs 165, or portions thereof, that are exposed through the second passivation layer 170. The LGA lands 180 may, for example, be formed while filling the first regions 171 of the second passivation layer 170. In addition, the LGA lands 180 may be further electrically insulated (or isolated) from each other by the second regions 172 of the second passivation layer 170. In an example embodiment of the present disclosure, the LGA lands 180 may be formed in the first regions 171. However, instead of the LGA lands 180, conductive balls (e.g., solder balls) or other conductive structures may be formed in the first regions 171.

Figure 5K:
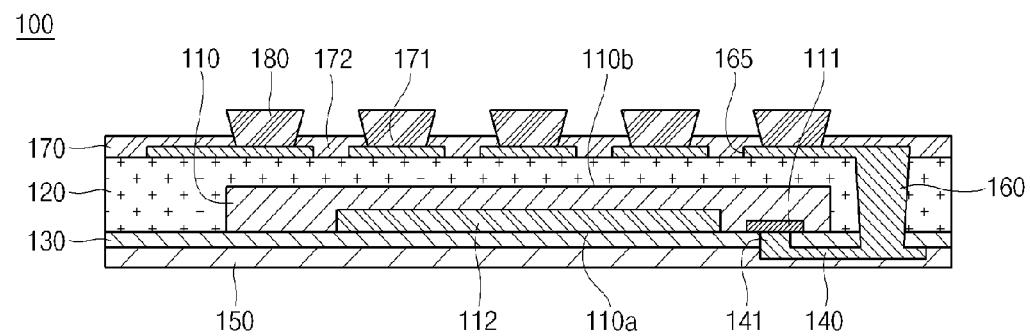

Referring to FIGS. 4 and 5K, in the removing of the protection layer (S11), the protection layer 150 may, for example, be subjected to grinding (or another thinning process) for removal. In the removing of the protection layer (S11), the grinding may, for example, be performed such that the protection layer 150 has a thickness of 200 μm or less. In FIG. 4K, the protection layer 150 is included in the finger print sensor package 100. However, the protection layer 150 need not be provided in the finger print sensor package 100.

As described above, in the finger print sensor package 100 according to an example embodiment of the present disclosure, the first RDLs 140 and the second RDLs 165 (or respective portions thereof) are formed over and under the semiconductor die 110, thereby electrically connecting the first RDLs 140 and the second RDLs 165 to each other through the vias 160, which for example are located outside the footprint of the semiconductor die 110. In such an example configuration, an ultra-slim finger print sensor package having a thickness of 500 μm or less may be fabricated without using a separate printed circuit board (PCB) or other substrate.

Figure 6:
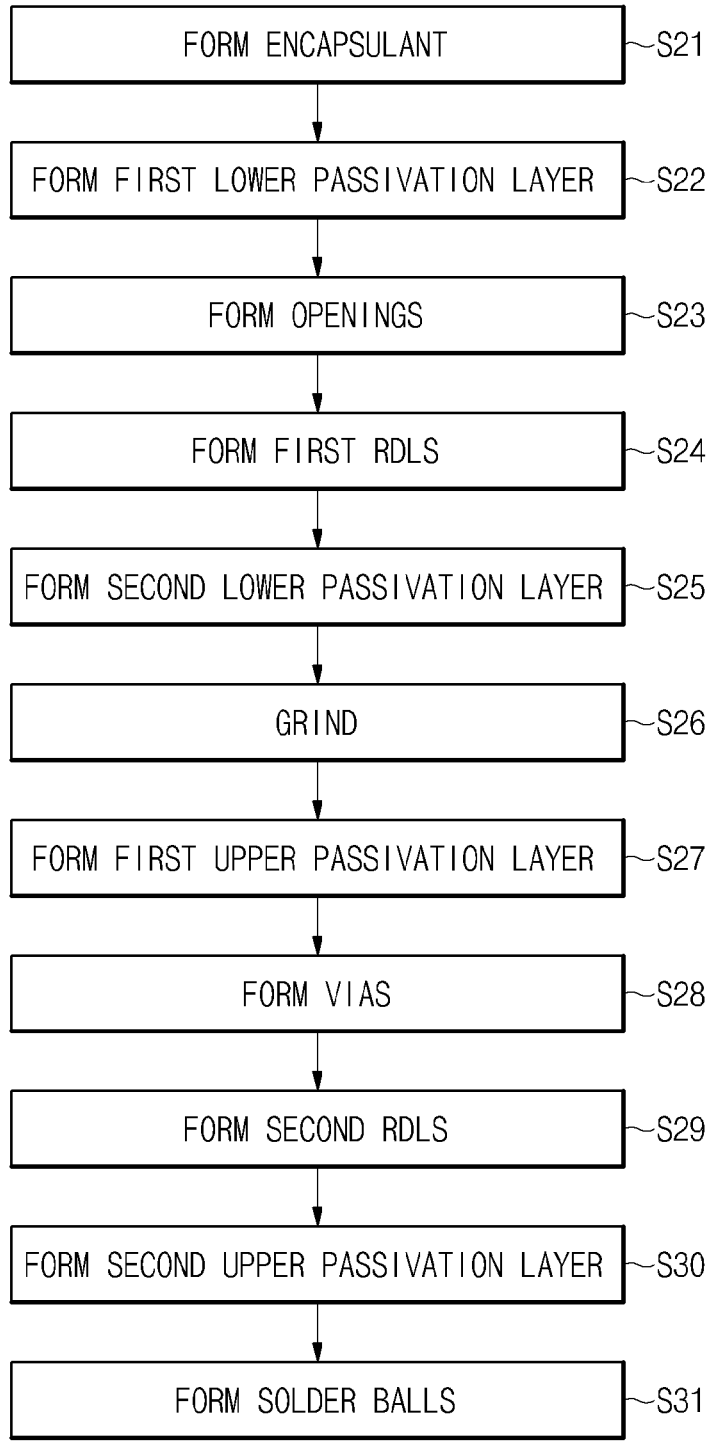
FIG. 6 is a flowchart illustrating a fabricating method of a package of a finger print sensor according to another example embodiment of the present disclosure.

FIG. 6 is a flowchart illustrating a fabricating method of a package of a finger print sensor according to another example embodiment of the present disclosure.

As illustrated in FIG. 6, a fabricating method of a finger print sensor package (e.g., the finger print sensor package 300 illustrated in FIG. 3, or variants thereof) according to an example embodiment of the present disclosure may comprise forming an encapsulant (S21), forming a first lower passivation layer (S22), forming openings (S23), forming first RDLs (S24), forming a second lower passivation layer (S25), grinding (S26), forming a first upper passivation layer (S27), forming vias (S28), forming second RDLs (S29), forming a second upper passivation layer (S30) and forming solder balls (S31).

FIGS. 7A to 7K are cross-sectional views sequentially illustrating example process steps of the fabricating method of a package of a finger print sensor shown in FIG. 6.

Hereinafter, the example fabricating method of a finger print sensor package (e.g., the example finger print sensor package 300 illustrated in FIG. 3 and discussed previously or variants thereof) according to an example embodiment of the present disclosure will be described in detail with reference to FIGS. 6 and 7A to 7K.

Figure 7A:
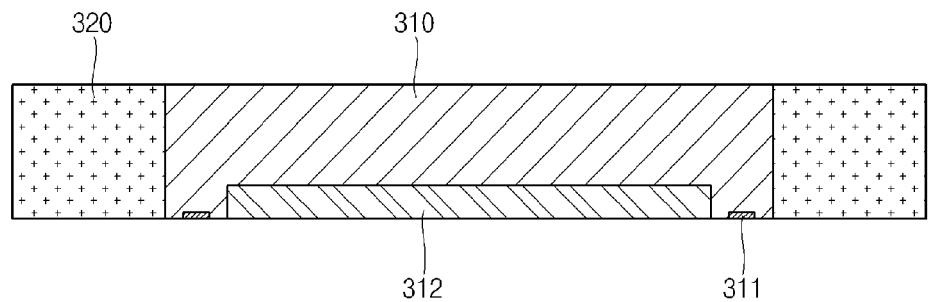
FIGS. 7A to 7K are cross-sectional views sequentially illustrating example process steps of the fabricating method of a package of a finger print sensor shown in FIG. 6.

Referring to FIGS. 6 and 7A, in the forming of an encapsulant (S21), the encapsulant 320 is formed on (or around) the semiconductor die 310. The semiconductor die 310 comprises a first surface having a plurality of bond pads 311 and a sensor 312 formed thereon and a second surface opposite to and facing the first surface. In addition, the encapsulant 320 is formed to enclose side surfaces of the semiconductor die 310, excluding the first and second surfaces. For example, the encapsulant 320 may be formed on regions horizontally extending from the first and second surfaces. The encapsulant 320 may, for example, be formed using an epoxy molding compound (EMC), painting, or printing.

Figure 7B:
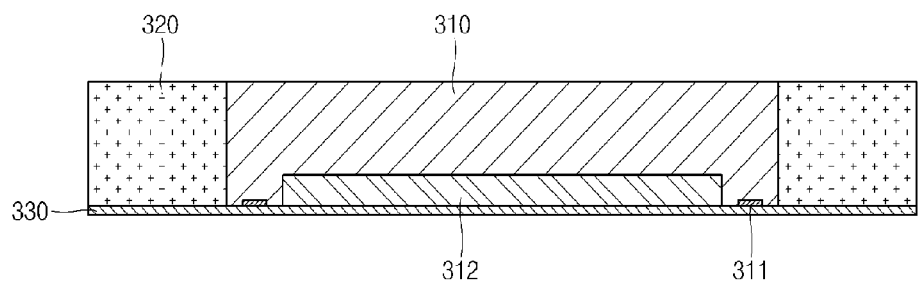

Referring to FIGS. 6 and 7B, in the forming of a first lower passivation layer (S22), the first lower passivation layer 330 is formed on the first surface of the semiconductor die 310. The first lower passivation layer 330 is formed to cover the first surface and a bottom surface of the encapsulant 320 that extends horizontally from the first surface of the semiconductor die 310.

Figure 7C:
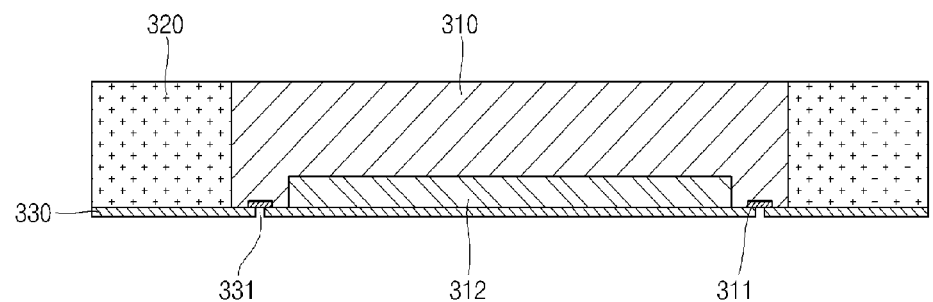

Referring to FIGS. 6 and 7C, in the forming of openings (S23), the openings 331 are formed in some regions of the first lower passivation layer 330. The forming of openings (S23) may, for example comprise forming a photoresist on the first lower passivation layer 330 and then etching and removing the photoresist. The openings 331 may, for example, be formed by etching the first lower passivation layer 330 using the photoresist. The openings 331 expose the bond pads 311.

Figure 7D:
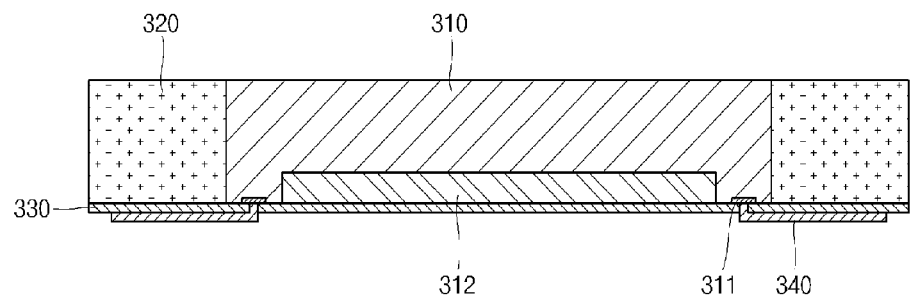

Referring to FIGS. 6 and 7D, in the forming of first RDLs (S24), the first RDLs 340 are formed on the first lower passivation layer 330 (e.g., below the first lower passivation layer 330 as it is shown in FIG. 7D) to extend to the outside of the semiconductor die 310 (e.g., outside the footprint of the semiconductor die 110). A first end of each of the first RDLs 340 may, for example, be formed while filling the openings 331.

The first RDLs 340 may, for example, be formed by electroplating. The forming of the first RDLs (S24) may, for example, comprise coating and patterning a photoresist on a region of the first lower passivation layer 330, other than potential regions where the first RDLs 340 are to be formed. In addition, a metal seed layer may be formed between the potential regions where the first RDLs 340 are to be formed, that is, patterns of the photoresist. Thereafter, current may be made to flow using the metal seed layer as a seed, thereby forming the first RDLs 340. After the forming of the first RDLs 340, the photoresist is removed. The first RDLs 340 may, for example, be made of copper or an equivalent thereof. As illustrated in FIG. 2 and discussed previously, the forming of the first RDLs (S4) may comprise forming one or more ground RDLs that surround the sensor 312, or any portion of the semiconductor die 110, on 1, 2, 3 or 4 sides.

Figure 7E:
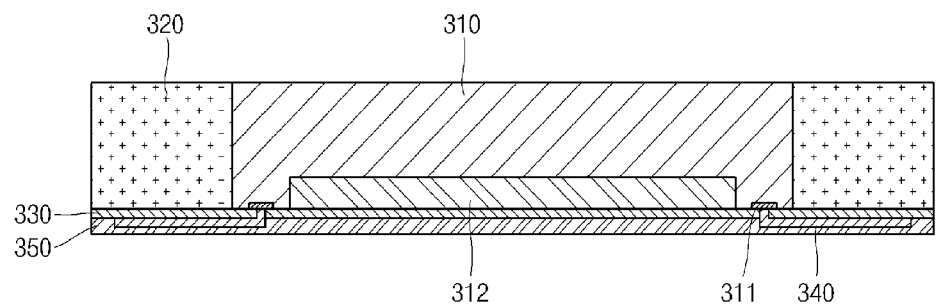

Referring to FIGS. 6 and 7E, in the forming a second lower passivation layer (S25), the second lower passivation layer 350 may be formed to cover the first lower passivation layer 330 and the first RDLs 340. The second lower passivation layer 350 may, for example, serve as a wafer supporting system (WSS) for supporting and fixing a semiconductor wafer. That is to say, the second lower passivation layer 330, formed on the first lower passivation layer 330 (e.g., under the lower passivation layer 330 as illustrated in FIG. 7E) and the first RDLs 340, fixedly supporting the semiconductor die 310. The second lower passivation layer 350 and the encapsulant 320 may, for example, be made of the same material, or for example different materials with same or similar respective CTEs).

Figure 7F:
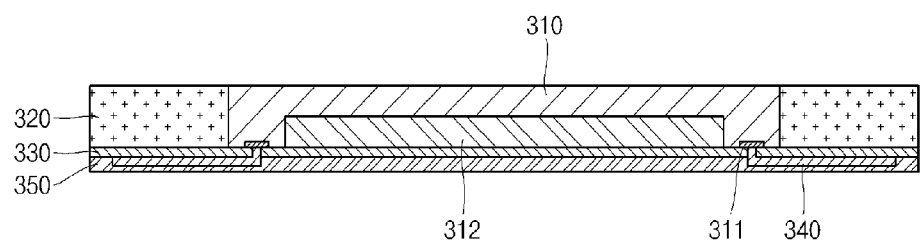

Referring to FIGS. 6 and 7F, in the grinding (S26), the semiconductor die 310 and the encapsulant 320 are subjected to grinding (or alternative thinning operation). The grinding (S26) may, for example, facilitate the formation of vias 370 in a subsequent process by reducing the thickness of the encapsulant 320. Here, the semiconductor die 310 is fixed to and/or supported by the second lower passivation layer 350, so that impacts applied thereto during grinding or other operations may be dampened.

Figure 7G:
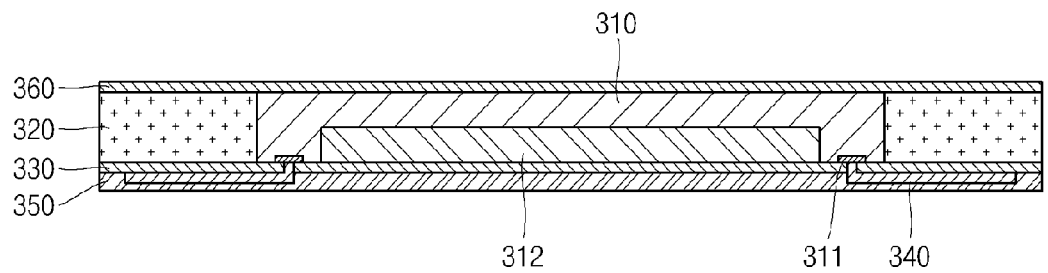

Referring to FIGS. 6 and 7G, in the forming of a first upper passivation layer (S27), the first upper passivation layer 360 is formed on the second surface of the semiconductor die 310. The first upper passivation layer 360 may, for example, be formed to cover the second surface of the semiconductor die 310 and a top surface of the encapsulant 320 that extends horizontally from the second surface of the semiconductor die 310.

Figure 7H:
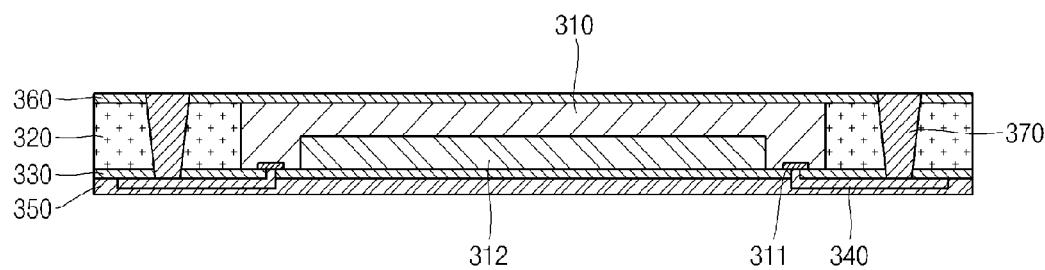

Referring to FIGS. 6 and 7H, in the forming of vias (S28), the vias 370 are formed to pass through the encapsulant 320. The vias 370 may, for example, be formed to pass through the encapsulant 320, the first lower passivation layer 330 and the first upper passivation layer 360. The vias 370 are electrically connected to the second end of each of the first RDLs 340 (e.g., the ends of the first RDLs 340 that are positioned outside the footprint of the first semiconductor die 310) and may, for example, be connected to the second RDLs 375 to be formed later. The vias 370 may, for example, be formed by forming holes in the encapsulant 320 using laser irradiation, drilling or chemically etching and then filling the holes with copper or an equivalent thereof.

Figure 7I:
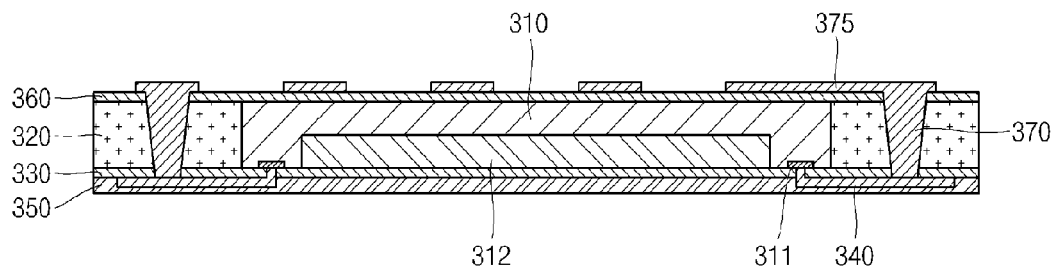

Referring to FIGS. 6 and 7I, in the forming of second RDLs (S29), the second RDLs 375 are formed on the first upper passivation layer 360 (e.g., above the first upper passivation layer 360 as illustrated in FIG. 7I). The second RDLs 375 are electrically connected to the vias 370. The second RDLs 375 may, for example, be spaced apart from each other by spaced-apart regions. Like the first RDLs 340, the second RDLs 375 may, for example, be formed by electroplating and may be made of copper or an equivalent thereof.

Figure 7J:
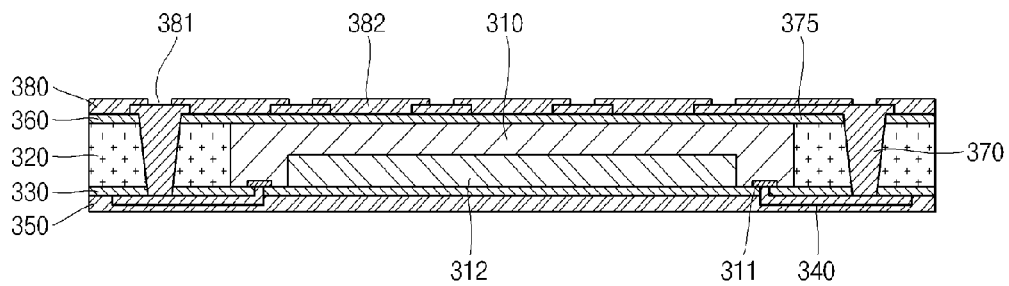

Referring to FIGS. 6 and 7J, in the forming of a second upper passivation layer (S30), the second upper passivation layer 380 is formed on the first upper passivation layer 360 and the second RDLs 375. The second upper passivation layer 380 may, for example, be formed by forming a photoresist on regions through which the second RDLs 375 are exposed and then filling the other regions with the second upper passivation layer 380. Therefore, the second upper passivation layer 380 may comprise first regions 381 through which the second RDLs 375 are exposed, and second regions 382 formed to cover portions of the second RDLs 375 that are not to be exposed and to cover the spaced-apart regions between the second RDLs 375. The second regions 382 fill the spaced-apart regions of the second RDLs 375, thereby further electrically insulating (or isolating) the plurality of second RDLs 375 from each other.

Figure 7K:
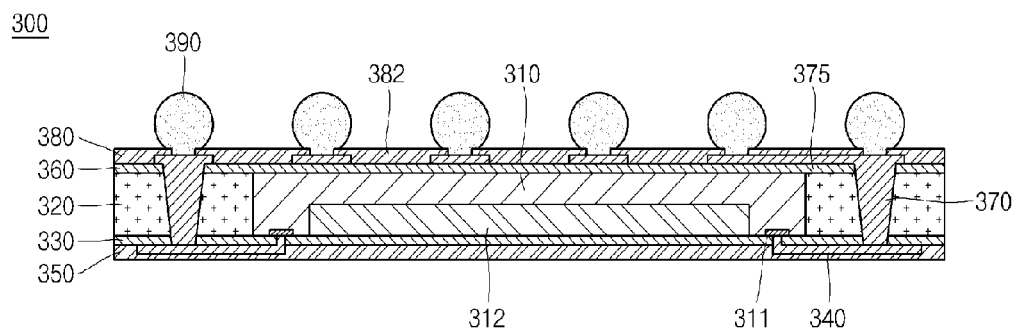

Referring to FIGS. 6 and 7K, in the forming of solder balls (S31), solder balls 390 (or other conductive balls or connecting structures) are formed on the second RDLs 375 exposed through the second upper passivation layer 380. The solder balls 390 may, for example, be formed while filling the first regions 381 of the second upper passivation layer 380 (e.g., filling the regions 381 with solder balls, solder paste, etc.). In addition, the solder balls 390 may be further electrically insulated from each other by the second regions 382 of the second upper passivation layer 380.

As described above, in a finger print sensor package 300 according to an example embodiment of the present disclosure, the encapsulant 320 might enclose only the side surfaces of the semiconductor die 310, and the first upper passivation layer 360, which is relatively thin, might then cover the second surface of the semiconductor die 310. In such an example configuration, an ultra-slim finger print sensor package (e.g., having a thickness of 500 um or less) may be fabricated, for example without using a separate printed circuit board (PCB) or other substrate.

This disclosure provides various example embodiments of a package of a finger print sensor and a fabricating method thereof. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure without departing from the spirit and scope of the present disclosure, for example as set forth in the following claims.

What is claimed is:

1. A semiconductor device comprising:
   a semiconductor die comprising a first die surface, a second die surface opposite the first die surface, and side die surfaces connecting the first and second die surfaces, where the first die surface comprises a bond pad;
   an encapsulant covering at least one of the side die surfaces and comprising a first encapsulant surface and a second encapsulant surface opposite the first encapsulant surface;
   a conductive via passing through at least the encapsulant between the first encapsulant surface and the second encapsulant surface, wherein the conductive via comprises a beveled side surface, and a first end of the conductive via is narrower than a second end of the conductive via;
a first conductive layer extending over at least a portion of the first die surface and over at least a portion of the first encapsulant surface, and electrically connected to the bond pad and the first end of the conductive via;
a second conductive layer extending over at least a portion of the second encapsulant surface, and electrically connected to the second end of the conductive via; and
an electrical interconnection structure coupled to the second conductive layer.

2. The semiconductor device of claim 1, wherein the second conductive layer does not directly contact the second encapsulant surface.

3. A semiconductor device comprising:
a semiconductor die comprising a first die surface, a second die surface opposite the first die surface, and side die surfaces connecting the first and second die surfaces, where the first die surface comprises a bond pad;
an encapsulant covering at least one of the side die surfaces and the second die surface, and comprising a first encapsulant surface and a second encapsulant surface opposite the first encapsulant surface;
a conductive via passing through at least the encapsulant between the first encapsulant surface and the second encapsulant surface;
a first conductive layer extending over at least a portion of the first die surface and over at least a portion of the first encapsulant surface, and electrically connected to the bond pad and a first end of the conductive via;
a second conductive layer extending over at least a portion of the second encapsulant surface, and electrically connected to a second end of the conductive via; and
an electrical interconnection structure coupled to the second conductive layer.

4. The semiconductor device of claim 3, wherein the second end of the conductive via is coplanar with the second encapsulant surface.

5. The semiconductor device of claim 3, wherein the encapsulant is the only insulation layer directly between the electrical interconnection structure and the semiconductor die.

6. A semiconductor device comprising:
a semiconductor die comprising a first die surface, a second die surface opposite the first die surface, and side die surfaces connecting the first and second die surfaces, where the first die surface comprises a bond pad;
an encapsulant covering at least one of the side die surfaces and comprising a first encapsulant surface and a second encapsulant surface opposite the first encapsulant surface;
a conductive via passing through at least the encapsulant between the first encapsulant surface and the second encapsulant surface;
a first conductive layer extending over at least a portion of the first die surface and over at least a portion of the first encapsulant surface, and electrically connected to the bond pad and a first end of the conductive via;
a second conductive layer extending over at least a portion of the second encapsulant surface, and electrically connected to a second end of the conductive via; and
an electrical interconnection structure coupled to the second conductive layer,
wherein a fan-in portion of the second conductive layer extends over at least a portion of the second die surface.

7. The semiconductor device of claim 6, wherein the electrical interconnection structure is attached to the fan-in portion of the second conductive layer.

8. A semiconductor device comprising:
a semiconductor die comprising a first die surface, a second die surface opposite the first die surface, and side die surfaces connecting the first and second die surfaces, where the first die surface comprises a bond pad;
an encapsulant covering at least one of the side die surfaces and comprising a first encapsulant surface and a second encapsulant surface opposite the first encapsulant surface;
a conductive via passing through at least the encapsulant between the first encapsulant surface and the second encapsulant surface;
a first conductive layer extending over at least a portion of the first die surface and over at least a portion of the first encapsulant surface, and electrically connected to the bond pad and a first end of the conductive via;
a second conductive layer extending over at least a portion of the second encapsulant surface, and electrically connected to a second end of the conductive via; and
an electrical interconnection structure coupled to the second conductive layer,
wherein the first conductive layer extends from the bond pad toward one of the side die surfaces and past the first end of the conductive via.

9. The semiconductor device of claim 8, comprising a dielectric layer that completely covers the first conductive layer.

10. A semiconductor device comprising:
a semiconductor die comprising a first die surface, a second die surface opposite the first die surface, and side die surfaces connecting the first and second die surfaces, where the first die surface comprises a bond pad, and wherein the semiconductor die is rectangular shaped with a first and second of the side die surfaces longer than a third and fourth of the side die surfaces;
an encapsulant covering at least one of the side die surfaces and comprising a first encapsulant surface and a second encapsulant surface opposite the first encapsulant surface;
a conductive via passing through at least the encapsulant between the first encapsulant surface and the second encapsulant surface;
a first conductive layer extending over at least a portion of the first die surface and over at least a portion of the first encapsulant surface, and electrically connected to the bond pad and a first end of the conductive via;
a second conductive layer extending over at least a portion of the second encapsulant surface, and electrically connected to a second end of the conductive via;
an electrical interconnection structure coupled to the second conductive layer; and
a first conductive trace, wherein:
the first conductive trace runs in a plane that is parallel to the first die surface and separated from the first die surface; and
the first conductive trace runs alongside the first side die surface along at least most of the length of the first side die surface.

11. The semiconductor device of claim 10, comprising a second conductive trace, wherein:
the second conductive trace runs in the plane that is parallel to the first die surface and separated from the first die surface; and
the second conductive trace runs alongside the second side die surface along at least most of the length of the second side die surface.

12. The semiconductor device of claim 10, wherein the encapsulant covers the second die surface.

13. The semiconductor device of claim 12, wherein the second end of the conductive via is coplanar with the second encapsulant surface.

14. The semiconductor device of claim 12, wherein the encapsulant is the only insulation layer directly between the electrical interconnection structure and the semiconductor die.

15. The semiconductor device of claim 10, wherein the first conductive layer extends from the bond pad toward one of the side die surfaces and past the first end of the conductive via.

16. A semiconductor device comprising:
a semiconductor die comprising a first die surface, a second die surface opposite the first die surface, and side die surfaces connecting the first and second die surfaces, where the first die surface comprises a bond pad;
an encapsulant covering at least one of the side die surfaces and comprising a first encapsulant surface and a second encapsulant surface opposite the first encapsulant surface;
a conductive via passing through at least the encapsulant between the first encapsulant surface and the second encapsulant surface;
a first conductive layer extending over at least a portion of the first die surface and over at least a portion of the first encapsulant surface, and electrically connected to the bond pad and a first end of the conductive via;
a dielectric layer that completely covers at least a side of the first conductive layer facing away from the semiconductor die;
a second conductive layer extending over at least a portion of the second encapsulant surface, and electrically connected to a second end of the conductive via; and
an electrical interconnection structure coupled to the second conductive layer.

17. The semiconductor device of claim 16, wherein there are no apertures extending completely through the dielectric layer.

18. The semiconductor device of claim 16, wherein the encapsulant covers the second die surface.

19. The semiconductor device of claim 18, wherein the second end of the conductive via is coplanar with the second encapsulant surface.

20. The semiconductor device of claim 18, wherein the encapsulant is the only insulation layer directly between the electrical interconnection structure and the semiconductor die.

* * * * *